(12) United States Patent
Lesartre et al.

(10) Patent No.: US 9,721,656 B2
(45) Date of Patent: Aug. 1, 2017

(54) ENCODED CROSS-POINT ARRAY

(71) Applicant: Hewlett Packard Enterprise Development LP, Houston, TX (US)

(72) Inventors: Gregg B. Lesartre, Fort Collins, CO (US); Gary Gibson, Palo Alto, CA (US); Erik Ordentlich, San Jose, CA (US); Yoocharn Jeon, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/113,908

(22) PCT Filed: Jan. 31, 2014

(86) PCT No.: PCT/US2014/014272
§ 371 (c)(1),
(2) Date: Jul. 25, 2016

(87) PCT Pub. No.: WO2015/116203
PCT Pub. Date: Aug. 6, 2015

(65) Prior Publication Data
US 2016/0343431 A1 Nov. 24, 2016

(51) Int. Cl.
*G11C 11/00* (2006.01)
*G11C 13/00* (2006.01)
*H01L 27/24* (2006.01)

(52) U.S. Cl.
CPC .......... *G11C 13/003* (2013.01); *G11C 13/004* (2013.01); *G11C 13/0026* (2013.01); *G11C 13/0028* (2013.01); *G11C 13/0069* (2013.01); *H01L 27/2463* (2013.01); *G11C 13/0023* (2013.01); *G11C 2213/77* (2013.01)

(58) Field of Classification Search
CPC .................................................... G11C 13/003
USPC ......................................................... 365/148
See application file for complete search history.

(56) References Cited

U.S. PATENT DOCUMENTS

| 8,000,161 | B2 | 8/2011 | Stan et al. |
| 8,392,770 | B2 | 3/2013 | Toda |
| 8,441,836 | B2 | 5/2013 | Parkinson et al. |
| 2005/0094459 | A1 | 5/2005 | Sesek et al. |
| 2006/0243956 | A1 | 11/2006 | Rinerson et al. |
| 2012/0017136 | A1 | 1/2012 | Ordentlich et al. |

(Continued)

OTHER PUBLICATIONS

International Searching Authority, The International Search Report and the Written Opinion, Oct. 22, 2014, 10 Pgs.

(Continued)

*Primary Examiner* — Hoa V Ho
(74) *Attorney, Agent, or Firm* — Patent Law Offices of David Millers

(57) ABSTRACT

A device includes a cross-point array and an access circuit to access subsets of memory elements respectively corresponding to encoded blocks of data. For each of the subsets of memory elements, a row or a column of the cross-point array that includes a first memory element in the subset and a second memory element in the subset further includes a third memory element that is between the first and second memory elements along the row or column and is in one of the subsets corresponding to another of the encoded blocks.

20 Claims, 5 Drawing Sheets

(56) References Cited

U.S. PATENT DOCUMENTS

2012/0240006 A1\* 9/2012 Hu .................. H03M 13/253
714/756
2013/0003437 A1 1/2013 Siau
2013/0044011 A1 2/2013 Ordentlich et al.
2013/0054886 A1 2/2013 Eshraghian et al.
2013/0103888 A1\* 4/2013 Ordentlich ............ G11C 16/00
711/103

OTHER PUBLICATIONS

Sotiriadis, P.P., et al., Nanoscale Data Storage Devices Capacity and Encoding Schemes [online], Sep. 2006, IEEE, Retrieved from Internet: <http://ieeexplore.ieee.org/stamp/stamp.jsp?arnumber=4152812> [retrieved on Dec. 20, 2013] 4 pages.

\* cited by examiner

ENCODED CROSS-POINT ARRAY

BACKGROUND

Cross-point memory arrays generally employ memory elements, e.g., memristor memory elements, at locations where conductive row and column lines cross. A memory element in a cross-point array may be read by applying a read voltage to the row line that crosses the memory element and sensing a current that passes from the row line and through the target memory element to a column line. Similarly, some cross-point array systems write a value to a memory element by applying a write or erase voltage between the row and column lines that cross at the memory element. The write voltage is of sufficient magnitude and appropriate polarity to change the storage state of the target memory element and is generally higher than the read voltage. For example, for a memristor memory element, the write voltage may be high enough to cause an ionic current in the memory element, and the resulting movement of ions changes a resistance state of the memory element. In contrast, the read voltage provides an electronic current of measurable magnitude at least through a low resistance state of the memory element but is low enough to avoid causing an unacceptable ionic current.

Data stored in a cross-point array can alter the performance of the cross-point array, particularly if the stored data has a problematic pattern. For example, a large number of memory elements in low resistance states and connected to the same column line or the same row line may cause that row or column line to have a large capacitance or a large leakage current, which may affect the speed or accuracy of read or write operations.

Encoding the data that is stored in a cross-point array can mitigate or reduce variability in memory performance. In particular, a block of data may be encoded using a coding technique that limits the number of conductive memory elements along any rows and/or columns of memory elements storing the encoded block of data. The encoding of data may thus limit variations in the capacitance or leakage current of row or column lines, and a cross-point memory array storing encoded data may be able to use smaller and more energy efficient peripheral circuits or achieve better performance.

BRIEF DESCRIPTION OF THE DRAWINGS

Use of the same reference symbols in different eat figures indicates similar or identical items.

DETAILED DESCRIPTION

Cross-point memory arrays allow dense storage of data but may be subject to memory element interactions that depend on the data stored. In particular, a data value, e.g., a binary value 0 or 1, stored in a memory element of a cross-point array may correspond to a conductivity state of the memory element, so that some data patterns may create larger numbers of conductive memory elements in a row or column, which in turn can change the electrical characteristics of the row or column. To reduce the variability of memory element interactions, encoding techniques can convert raw data, which may have any value, into encoded data having values that provide desirable memory performance. For example, raw binary data may be encoded to create a encode block of data, e.g., a two dimensional array of bits, in which each row and each column of the encoded block contains predetermined numbers of ones and zeros. A cross-point memory array storing the encoded blocks may provide consistent performance because regardless of the data represented, each row or each column of the array has the same number of conductive memory elements.

An encoding technique for data in a cross-point array typically encodes multiple separately addressable data units, e.g., multiple bytes or words of data, into an encoded block. As a result, reading or writing of one data unit in the cross-point array may require accessing all of the memory elements corresponding to the encoded block in which the data unit is encoded. Repeated accesses to data units encoded in the same encoded block may cause local heating of the area of the cross-point array corresponding to the encoded block, which could result in device performance or reliability issues. In one implementation of a cross-point array, the memory elements corresponding to encoded blocks do not form contiguous blocks but are distributed to spread heating or data disturbance over an extended area of the cross-point array.

Figure 1:
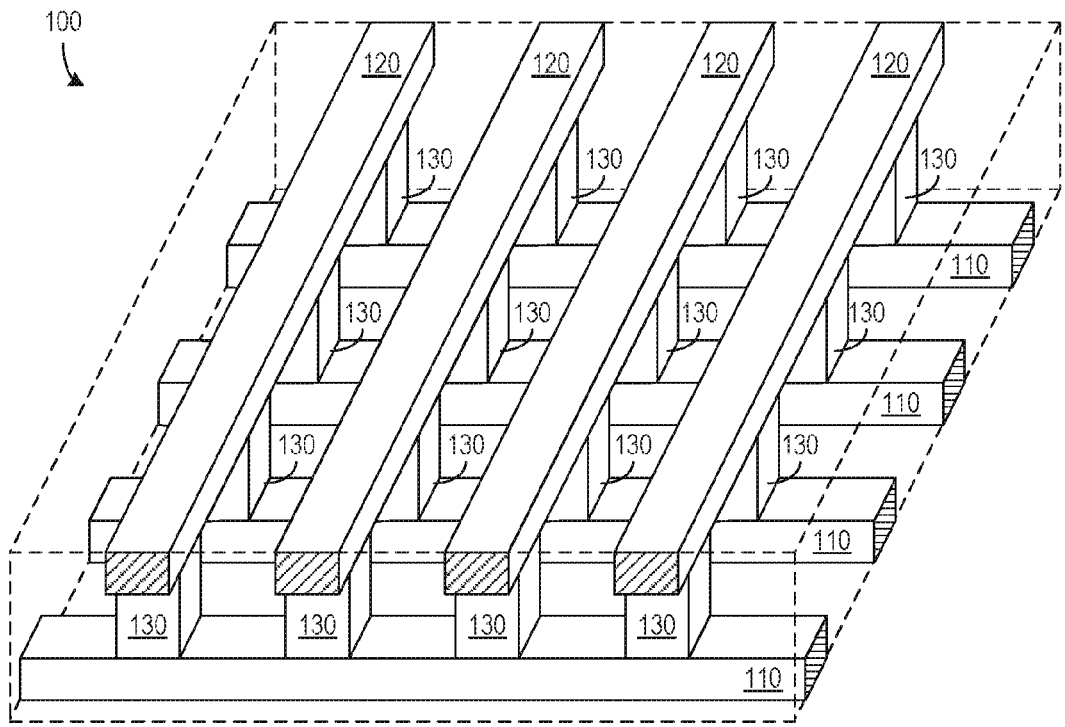
FIG. 1 shows a perspective view of an example of a cross-point memory array.

FIG. 1 shows a perspective view of one implementation of a cross-point array 100. Cross-point array 100 includes conductive row lines 110, conductive column lines 120, and an array of memory elements 130 at locations where row and column lines 110 and 120 cross. Some examples of types of memory elements 130 for use in a cross-point array 100 include memristor memory elements and memory elements using phase change, spin torque transfer, and other memory technologies suitable for cross-point arrays. In a practical implementation, row lines 110, column lines 120, and memory elements 130 may be within an insulating material inside an integrated circuit that includes peripheral circuitry or other circuit elements connected to cross-point array 100, and row and column lines 110 and 120 may number in the hundreds or thousands to provide cross-point array 100 with on the order of a million bits of storage. Each memory element 130 in array 100 has states indicating data values that may be distinguished or sensed through an electrical interaction between the row line 110 and the column line 120 that cross at the memory element 130. For example, if memory elements 130 are memristor memory elements, the binary value stored in each memory element 130 may be represented by a high or low resistance state of the memory element 130, and the resistance states may be distinguished or sensed according to a current draw when a read voltage differences is applied between the row and column lines 110 and 120 that cross at the memory element 130.

Figure 2A:
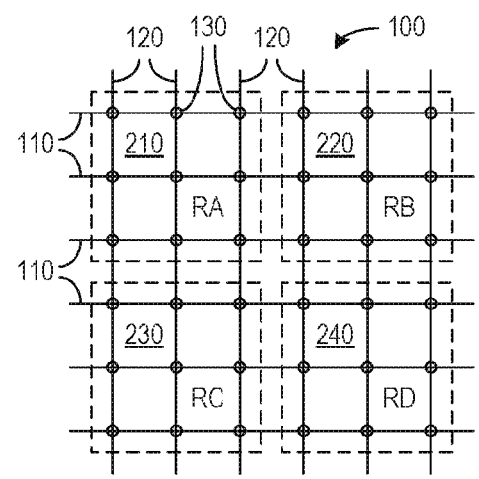
FIG. 2A illustrates an example of a portion of a cross-point array storing raw data.

FIG. 2A illustrates one strategy for storage of data in a portion of cross-point array 100. With the strategy of FIG. 2A, raw data is stored in cross-point array 100 without encoding. In general, data values in raw data are unrestricted, so that cross-point array 100 can contain data in any pattern. For example, a particular row line 110 or column line 120 may cross memory elements 130 that are all in low resistance state, all in a high resistance state, or contain any mixture of high and low resistance states.

The different data patterns possible for array 100 with the data storage strategy of FIG. 2A can result in variations in memory performance. For example, a target memory element 130 may be read from cross-point array 100 by applying a read voltage to the row line 110 crossing the target memory element and then sensing the resulting current on the column line 120 crossing the target memory element 130. The current draw required for reading of a data value from a target memory element 130 may vary depending on current wasted, e.g., as a "sneak" current through other memory elements 130, when the target memory element 130 is read. When the stored data values in cross-point array 100 are unrestricted, a worst case for sneak current may occur when all of the memory elements 130 have low resistance states, and drive circuits (not shown) that provide the read voltage must be sized to handle that worst case current. Also, the time required for the voltage differential between target row and column lines 110 and 120 to settle sufficiently for reliable operation of a sense amplifier (not shown) may vary according to how much of the read current passes through the target memory element 130 relative to the current that follows the sneak paths. As a result, the data storage strategy illustrated in FIG. 2A may require relatively large drive transistors and still provide slow read times.

The voltage applied to a target memory element 130 during a write or erase operation may also depend on the resistive states of other memory elements 130 in array 100 (particularly the memory elements 130 on the same row and column lines 110 and 120 as the addressed memory element 130) and depend on the resistances of those states relative to the line resistances of row and column lines 110 and 120. Differences in data patterns can result in variations in the local write voltages at target memory elements 130, and the local write voltage variations can cause variations in the resistances of the stored states, which could cause data reliability problems. Further, sneak currents could dominate the total current drawn during a write operation and may be the principal limitation on how large array 100 can be and still be programmed by a given density of row/column driver transistors (not shown).

Figure 2B:
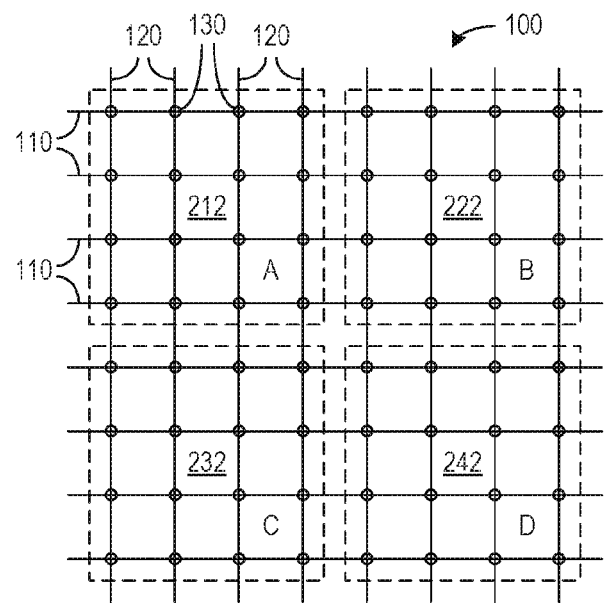
FIG. 2B illustrates an example of physical locations of memory elements in one implementation of a cross-point array that stores encoded data.

One data control technique that reduces memory performance variability encodes the data to provide a desired ratio of ones and zeros across the rows and columns of the array. Another data control technique that reduces memory performance variability may encode the data to provide a desired ratio of ones and zeros across just the rows or just the columns of the array, without restricting the data pattern along the other column or row direction. Still other data control techniques may encode the data to limit the number of low resistance states along just the rows, just the columns, or both the rows and the columns of the array, without limiting the number of high resistance states. For example, the raw data can be partitioned into data block RA, RB, RC, and RD, which would be stored in memory element blocks 210, 220, 230, and 240 using the storage strategy of FIG. 2A. The raw data blocks RA, RB, RC, and RD can be encoded to construct encoded blocks A, B, C, and D that when stored in cross-point array 100 provide the characteristics desired according to the data control technique employed. FIG. 2B illustrates an example in which cross-point array 100 stores encoded blocks A, B, C, and D in blocks 212, 222, 232, and 242 of memory elements 130. For example, an encoding process operating on blocks RA, RB, RC, and RD of raw data shown in FIG. 2A may produce an encoded block A, B, C, and D that when stored in respective blocks 212, 222, 232, and 234 of memory elements 130 causes no more than a fixed number of memory elements 130 in each row or each column of memory blocks 212, 222, 232, and 234 to be in the low resistance state. Such encoding techniques generally produce encoded blocks A, B, C, and D containing more bits than are in the raw data RA, RB, RC, and RD. Accordingly, memory blocks 212, 222, 232 and 242 storing encoded blocks may be larger than memory blocks 210, 220, 230, and 240, which could store the raw data. Memory blocks 210, 220, 230, and 240 can be arranged as shown in FIG. 2B, so that the characteristics of the encoded data blocks extend over the entire array, e.g., each row line 110 and each column line 120 crosses the same number of low (high) resistance memory elements. As a result, the performance variability caused by variations in the stored data pattern can be largely eliminated.

Some suitable techniques for encoding data for storage in cross-point arrays are described, for example, in U.S. Pat. App, Pub. No. 2013/0097396, entitled "Method and System for Encoding Data for Storage in a Memory Array" and U.S. Pat. App. Pub. No. 2013/0121062, entitled "Rewriting a Memory Array."

Encoding data as in the storage strategy of FIG. 2B does raise other issues. In particular, if any part of the raw data encoded into a block A, B, C, or D changes, the whole block A, B, C, or D needs to be re-encoded and rewritten to store the new data in memory block 212, 222, 232, or 242. As a result, the data storage strategy of FIG. 2B, which stores encoded blocks, may require more read and write operations on memory elements 130. With many types of memory elements, particularly with memristor memory elements, writing data into array 100 causes local heating, and the writing many physically adjacent memory elements 130 in quick succession can result in cumulative heating that may harm the performance or the long-term reliability of memory array 100. Additionally, dense local activity in an area of cross-point array 100 may create a higher likelihood of local upset or disturb of previously stored values or may cause variability in the resistances of the states obtained during write or erase processes due to thermal crosstalk.

Figure 2C:
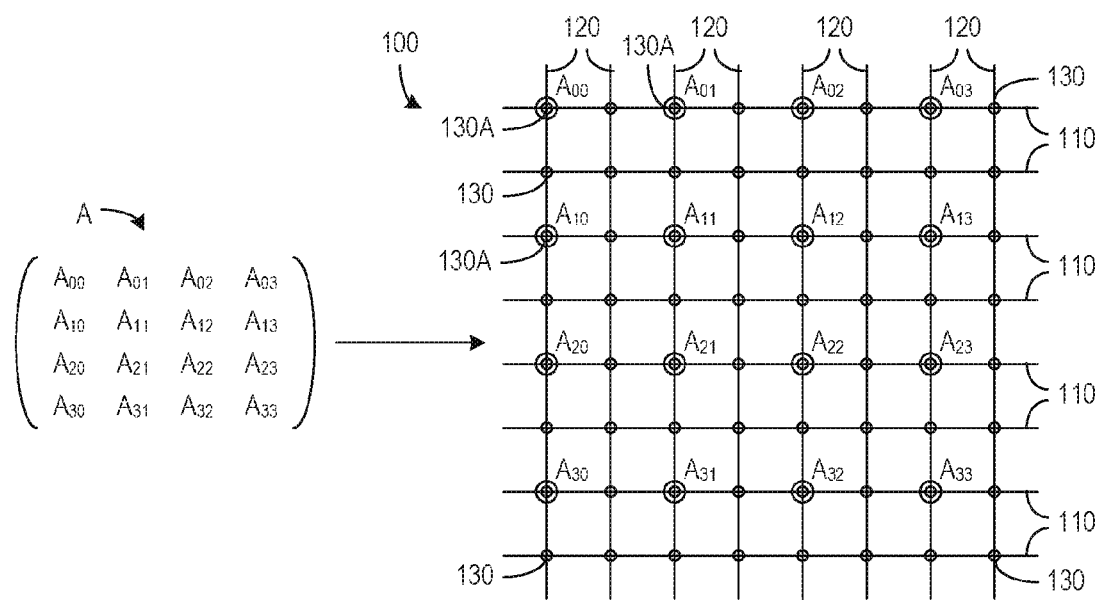
FIGS. 2C and 2D illustrate another example of a cross-point array that stores encoded data in physical locations that are distributed over an extended area of the array.
Figure 2D:
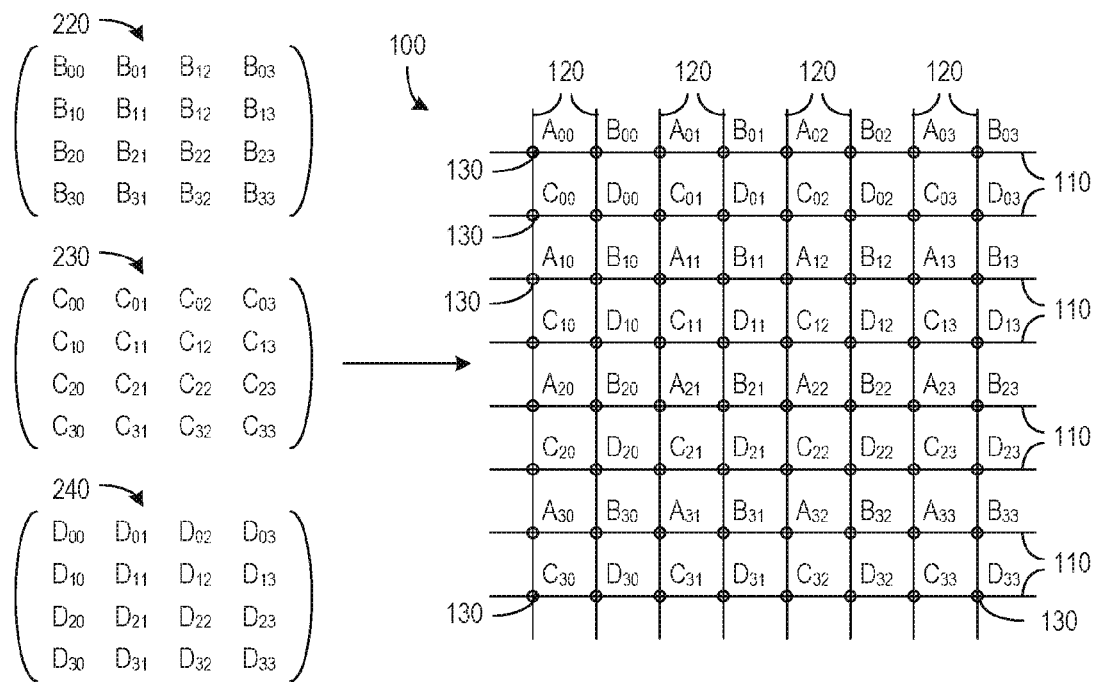

FIGS. 2C and 2D illustrate one implementation of a storage strategy that distributes encoded data across extended portions of a cross-point memory array 100 and thereby avoids concentrating local heating in a small area of cross-point array 100. As shown in FIG. 2C, an encoded block A can be a two-dimensional array of values, e.g., data elements $A_{00}$ to $A_{33}$, that have desired characteristics such as providing fixed or limited numbers zeros or ones in each row or column of the array. For illustration, FIG. 2C shows an encoded block A corresponding to a matrix of data elements $A_{00}$ to $A_{33}$, but encoded data can correspond to a matrix having any number of rows and any number of columns. Each of data elements $A_{00}$ to $A_{33}$ may be a single bit or may be a larger unit of data. For simplicity of description, the following assumes that data elements $A_{00}$ to $A_{33}$ are bits. With the storage strategy of FIG. 2C, the matrix of data elements $A_{00}$ to $A_{33}$ is not stored in a contiguous rectangular sub-region of cross-point array 100. Instead, multiple data elements of encoded block A are separated and distributed across an extended area of array 100. To preserve a desired data pattern characteristic of encoded block A such as providing a fixed number of memory elements 130 in a low resistance state along any row line 110 or column line 120, the data elements or bits in the same row of encoded block A may be scattered along the same row line 110 in cross-point array 100, and the data values in the same column of encoded block A may be scattered along the same column line 120 of array 100. For example, data elements $A_{00}$ to $A_{03}$ from the first row of encoded block A are stored in scattered memory elements 130 along the same row line 110. The scattering of bits $A_{00}$ to $A_{03}$ in a row of array 100 leaves in that row some memory elements 130 between consecutive data elements from encoded block A of array 100 and available for storage of portions of other encoded blocks. Similarly, other rows of elements $A_{10}$ to $A_{13}$, $A_{20}$ in $A_{23}$ and $A_{30}$ to $A_{33}$ are scattered in other respective rows of array 100. Also, scattering data elements from the same column of the encoded block A along a column line 120 of cross-point array 100 allows storage of data elements from other encoded blocks between consecutive data elements of encoded block A.

FIG. 2D further shows how data elements of encoded blocks A, B, C, and D may be interwoven in memory elements 130 to fill all or a portion of cross-point array 100. The assignment scatters each of encoded blocks A, B, C, and D across an extended area or the entirety of array 100, so that any contiguous rectangular area of array 100 containing all data elements of any encoded block A, B, C, or D also contains data elements of other encoded blocks. Also, the characteristics of rows and columns of encoded blocks A, B, C, and D may be preserved across the extended area or the entirety of array 100 by preserving the property that the portions of an encoded block that are in the same row or column in an encoded block are stored in the same row or column of memory elements in the cross-point array.

One specific implementation of a memory system stores each encoded block in a set of memory elements with physical row and/or column addresses that are mathematically related. For example, given an integer index i identifying an encoded block Ei, the data elements in a row j of a matrix representing the encoded block may be stored in a row of a cross-point array having a physical row address given in Equation 1, where m is an integer that is generally greater than 1 and may be selected according to the dimensions of the matrix representing the encoded block, the size of the cross-point array, the size of the portion of the cross-point array over which data blocks are spread, and/or the number of encoded blocks potentially stored in the cross-point array or the portion of cross-point array over which data blocks are spread. In the example of FIG. 2D, m is equal to 2 and encoded block A may be assigned index i=0, so that given Equation 1, the bits in rows 0, 1, 2, and 3 of encoded block A are distributed along rows 0, 2, 4, and 6 of array 100. More generally, rows 0, 1, 2, . . . of an encoded block having a block index if may be in rows i, m+i, 2m+i, . . .

Physical Row Address=$j*m+i$              Equation 1:

Similarly, a memory system may store each encoded block Ei in a set of memory elements with physical column addresses that are mathematically related. For example, given an integer index i identifying an encoded blocks Ei, the bits in a column k of encoded block Ei may be stored in a column of a cross-point array having a column address given in Equation 2, where l is an integer that is generally greater than 1 and may be selected according to the dimensions of each encoded block, the size of array 310, the portion of array 310 over which data blocks are spread, or the number of encoded blocks potentially stored. In the example of FIG. 2B, l is equal to 2, and according to the relation given in Equation 2, the bits in columns 0, 1, 2, and 3 of encoded block A (assigned index i=0 above) are distributed along columns 0, 2, 4, and 6 of cross-point array 100, but more generally columns 0, 1, 2, . . . of an encode block corresponding to an index i may be in columns i, l+i, 2l+1, . . .

Physical Column Address=$k*l+i$             Equation 2:

In different implementations, one or both of Equations 1 and 2 may be employed to select where bits from encoded blocks are stored. In some implementations, parameter m of Equation 1 is equal to parameter 1 of Equation 2. Further, Equation 1 and 2 can be varied in a variety of manners. For example, respective offsets may be added to the physical row and column addresses to repeat or interweave a data storage strategy in the cross-point array 100.

Figure 3:
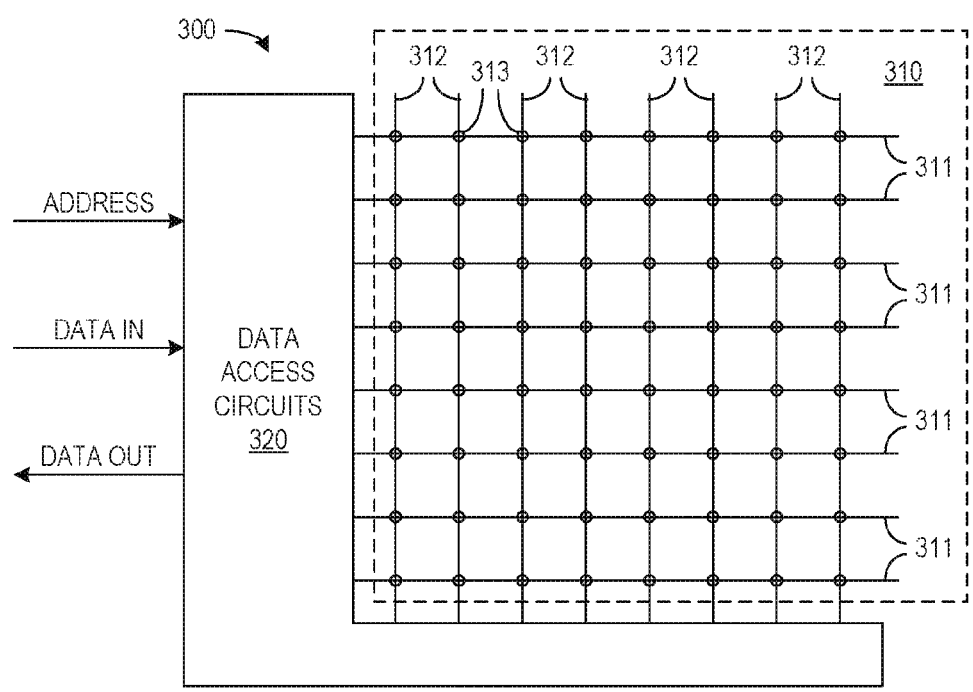
FIG. 3 shows an example of an implementation of a memory system that stores encoded data blocks at physical locations distributed across extended areas of a cross-point array.

FIG. 3 illustrates a memory system 300 including a cross-point array 310 and data access circuits 320. Cross-point array 310 includes row lines 311, column lines 312, and memory elements 313, which may be the same as corresponding elements of cross-point array 100 of FIG. 1 as described above. Data access circuits 320 implements a data storage technique for storing component values from encoded blocks in memory elements 313 that are distributed across an extended area of array 100. Data access circuits 320 may particularly include a memory controller, data buffers, encoding and decoding modules, read and write control circuits, address decoders, row and column line drivers, and sense amplifiers.

During operation of memory system 300, data access circuits 320 may receive a logical address for data to be accessed, i.e., read or written. For example, a target address may correspond to a portion of the data encoded in a target encoded block having a block index i. In that case, data access circuits 320 may perform a read operation by reading the data values from memory elements 313 that store the target encoded data block, decoding the encoded block just read, extracting from the decoded data the data unit associated with the target address, and outputting the extracted data unit. For a write operation, data access circuits 320 may read the previously stored encoded block covering the target address, decode the encoded block just read, modify the decoded data block to include the data input to access circuits 320, encode the modified data block to create a new encoded block, and write the new encoded data block to the memory elements associated with the encoded block.

Data access circuits 320 of memory system 300 can be specifically implemented for operations that access the memory elements assigned to encoded blocks. For example, a read from or a write to cross-point array 310 can automatically access multiple non-adjacent row lines 311 that cross memory elements 313 storing data elements of a targeted encoded block and automatically access multiple non-adjacent column lines 312 that cross memory elements 313 storing portions of the target encoded block.

Figure 4:
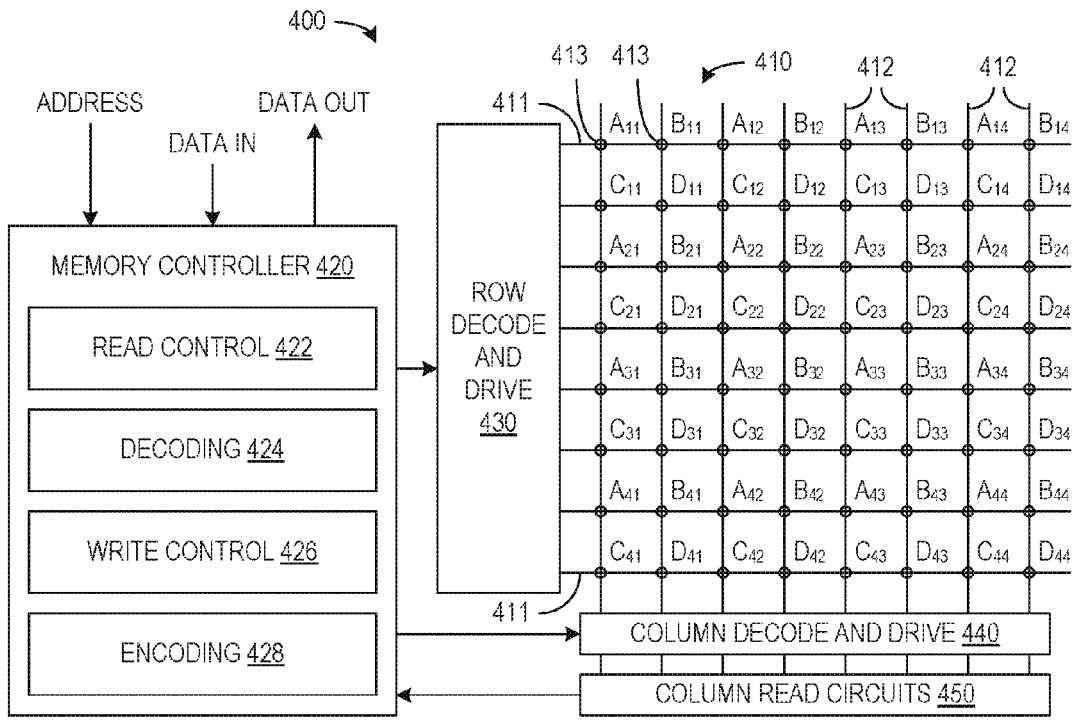
FIG. 4 shows another example of an implementation of a memory system that stores encoded data blocks at physical locations distributed across an area of a cross-point array.

FIG. 4 shows more details of a specific implementation of a memory system 400 that distributes data elements from encoded blocks across extended areas. Memory system 400 includes a cross-point array 410 that has row lines 411, column lines 412, and memory elements 413, which may be similar or identical to corresponding structures such as described for cross-point array 100 of FIG. 1. Data access circuits of memory system 400 include a memory controller 420, row decode and drive circuits 430, column decode and drive circuits 440, and column read circuits 450.

Row decode and drive circuits 430 include circuitry for receiving row address information and applying appropriate read or write voltages to one or more selected row lines 411. As disclosed herein, data elements from the same column of an encoded block may correspond to memory elements 413 scattered along the same column line 412 of array 410. Accordingly, the row lines 411 that correspond to adjacent data elements in an encoded block may not be adjacent in cross-point array 410. Row decoding in circuits 430 may be implemented in a conventional manner no that consecutive row addresses correspond to row lines that are physically adjacent in array 410. In which case, memory controller 410 may step a row address, e.g., by a parameter m for a storage strategy characterized by Equation 1 above, for data elements that are adjacent in an encoded block. Alternatively, decoding in circuits 430 may be implemented so that consecutive row addresses correspond to row lines 411 separated in array 400 by one or more intervening row lines 411. In which case, memory controller 410 may simply increment the row address to step between rows of array 400 separated by a number of rows, e.g., by m−1 rows.

Write decode and drive circuits 440 include circuitry for receiving column address information identifying one or more selected column lines 412 crossing memory elements 413 from which a data element is to be read or to which a data element is to be written. For a read operation, column decoding in circuits 440 may connect column read circuits 450, e.g., one or more sense amplifiers and read bias circuits, to the selected column line or lines 412. For a write operation, column decoding in circuits 440 may connect an appropriate bias voltage or voltages to the selected column line or lines 412 as needed to write a data element or data elements to one or more memory elements 413. As disclosed herein, data elements from the same row of an encoded block may correspond to memory elements 413 scattered along the same row line 411 of array 410. Accordingly, the column lines 412 that correspond to an encoded block may not be adjacent in cross-point array 410. Column decoding in circuits 440 may be implemented in a conventional manner so that consecutive column address values correspond to columns lines 412 that are physically adjacent in array 410. In which case, memory controller 410 may step a column line address, e.g., by a parameter l for a storage strategy characterized by Equation 2 above, to employ separated column lines 412 for storing adjacent data elements of an encoded block. Alternatively, column decoding in circuits 440 may be implemented so that consecutive column addresses correspond to column lines 412 separated in array 400 by one or more intervening row lines 412. In which case, memory controller 420 may simply increment the column address to step between columns of array 400 separated by a number of intervening columns, e.g., l−1 columns.

Memory controller 420 may be a digital circuit that manages the flow of data to and from cross-point memory array 410. In some cases, memory controller 420 may be integrated with cross-point array 410 in the same integrated circuit package or semiconductor chip. In other cases, some portion or all of memory controller 420 may be separate from cross-point array 410. For example, memory controller 420 may be fully or partially implemented on a dedicated memory controller chip or may be fully or partially implemented by a processor executing program instructions that cause the processor to perform some or all of the functions described herein for memory controller 420. For example, encoding or decoding software may be embodied as a computer readable medium and may be configured to cause a processor (not shown) to execute instructions related to encoding data to be stored in cross-point array 410 or decoding data that was stored in cross-point array 400.

In the implementation of FIG. 4, memory controller 420 includes a read control module 422, a decoding module 424, a write control module 426, and an encoding module 428. Each of modules 422, 424, 426, and 428 may include, for example, hardware devices including electronic circuitry for implementing the functionality described herein. In addition or as an alternative, each module 422, 424, 426, and 428 may be partly or fully implemented by a processor executing instructions encoded on a machine-readable storage medium.

Figure 5:
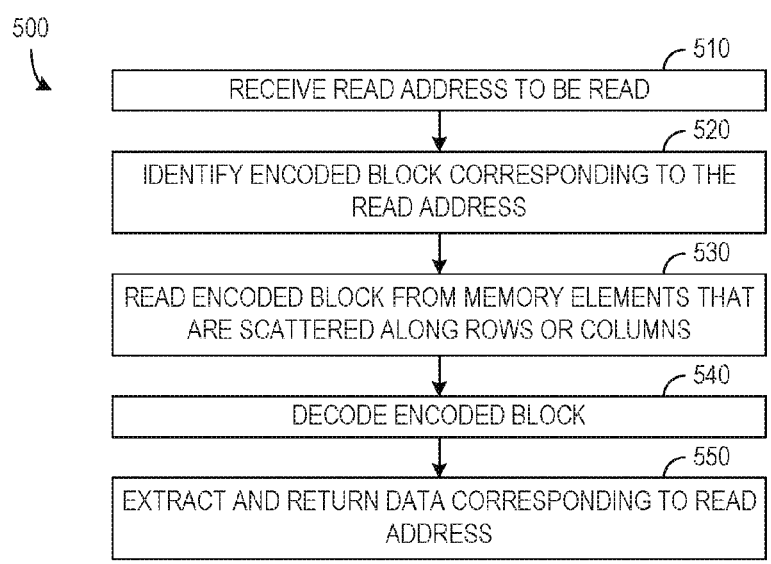
FIG. 5 is a flow diagram illustrating an example of a process for reading data in a cross-point array storing encoded blocks and scattered physical addresses.

Read control module 42 controls read operations which may be conducted according to a process 500 illustrated by the flow diagram of FIG. 5. In a process block 510 of process 500, read control module 422 receives a read address and identifies (in process block 520) an encoded block corresponding to the read address. For example, read controller 422 may identify an index corresponding to an encoded block and/or identify row and column addresses corresponding to memory elements 413 that store the target encoded block. In process block 530, row and column addresses are sent to circuits 430 and 440 with appropriate commands causing reading of the scattered memory elements 413 associated with the identified encoded block. The data elements read from the scattered memory elements 153 may be collected to form a matrix in a buffer (not shown). In process block 540, decoding module 424 decodes the encoded block, which may be an operation on a buffered matrix representing the encoded block. Other decoding methods, e.g., decoding module 424 serially decoding data elements as received from array 400, might alternatively be employed. In process block 550, the raw data corresponding to the read address is extracted from the decoded data and output from memory system 400. The decoded raw data may have been stored in a buffer, for example, in memory controller 410.

Figure 6:
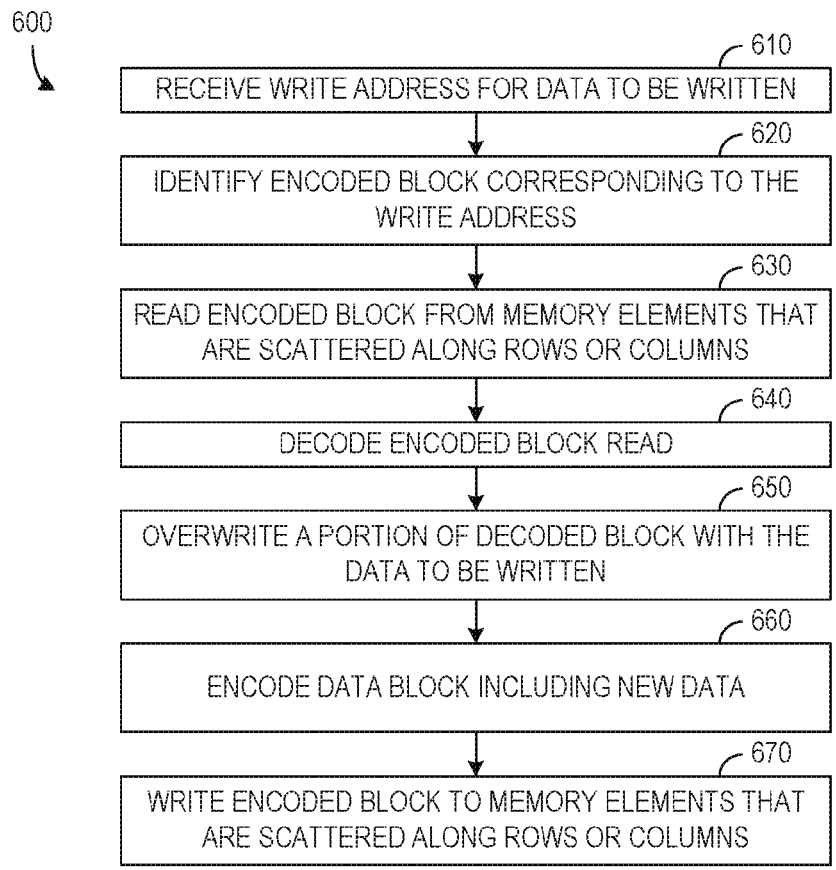
FIG. 6 is a flow diagram illustrating an example of a process for writing data in a cross-point array storing encoded blocks and scattered physical addresses.

Write control module 426 controls write or erase operations which may be conducted according to a process 600 illustrated by the flow diagram of FIG. 6. In a process block 610 of process 600, write control module 422 receives a write address and data to be written. (For an erase operation, the data to be written may have a predetermined "erase" value.) In process block 620, write control module 426 identifies an encoded block corresponding to the write address. For example, write controller 426 may identify an index corresponding to an encoded block and identify row and column addresses corresponding to the scattered memory elements 413 associated with the identified encoded block. In process block 630, row and column addresses are sent to circuits 430 and 440 with appropriate commands causing reading of the memory elements 413 associated with the identified encoded block. The encoded block read may be stored in a buffer not shown), which may be part of memory controller 410. In process block 640, decoding module 424 decodes the just-read encoded block, and the decoded raw data may be stored in a buffer (not shown). In process block 650, the raw data to be written replaces or overwrites a portion of the just-decoded block at a location corresponding to the write address. In a process block 660, encoding module 428 encodes the raw data block that was modified to include the raw data to be written. A process block 670 then writes the data elements of the newly encoded block to the scattered memory elements 413 that were recently read in block 430.

Some implementations of a write process to encoded memory may not need to include all steps shown in FIG. 6. For instance, if the data to be written includes all of an encoded block, the data may be encoded and then written to distributed memory elements 413 of the cross-point array without first reading the previous contents of the memory elements 413.

Figure 7:
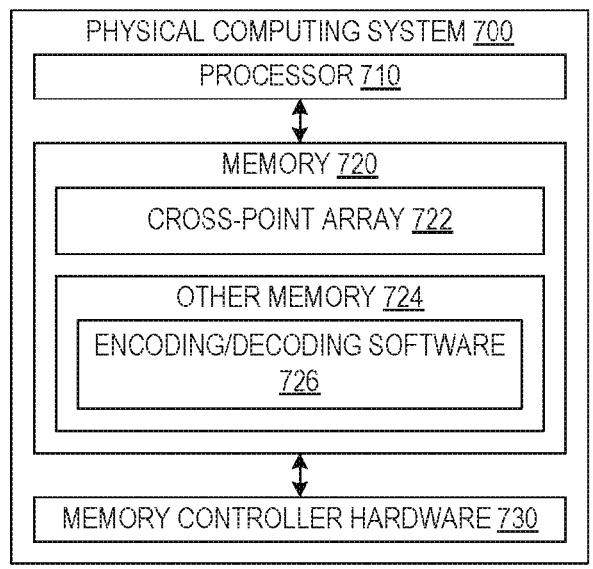
FIG. 7 illustrates an example of an implementation of a physical computing system storing encoded data in a cross-point array.

FIG. 7 shows an illustrative physical computing system 700 that may be used to encode the bits which are to be stored in a crossbar memory array. Physical computing system 700 may be any type of computing device including, but not limited to, a server, a desktop computer, a laptop computer, a pad computer, a Personal Digital Assistant (PDA), or a smart phone. In some implementations, physical computing system 700 may be a piece of hardware designed specifically for encoding or decoding bits. In the illustrated implementation, physical computing system 700 includes a processor 710 and memory 720 with associated memory controller hardware 730. Memory 720 includes a cross-point array 722 and other memory 724. Other memory 726, which may include ROM or other storage such as a magnetic disk drive, an optical disk drive, and/or an optical disk drive, stores encoding and decoding software 726 that may implement processes for conversion between raw data and encoded data blocks as described above. In particular, processor 710 executing encoding/decoding software 726 may implement portions of memory controller 420 of FIG. 4, while memory controller hardware 730 implements other portions of memory controller 420 of FIG. 4.

Storing data elements of encoded blocks in scattered data elements as described above may provide the advantages of reducing concentrated local heating while still providing the performance benefits of storing encoded data. A further advantage may be better tolerance of manufacturing defects. In particular, manufacturing defects may be large enough to cause several physically adjacent elements to be bad, which may result in an encoded block including multiple bad bits if the encoded block is stored in a contiguous block of memory elements. A single defect may possibly defeat error detection and correction algorithms, resulting, in corrupted data if encoded blocks are stored in contiguous areas. Physically separating the data elements from an encoded block may prevent a single defect from corrupting multiple bits in the encoded block, and thus may provide superior error resistance.

All or portions of some of the above-described systems and methods can be implemented in a computer-readable media, e.g., a non-transient media, such as an optical or magnetic disk, a memory card, or other solid state storage containing instructions that a computing device can execute to perform specific processes that are described herein. Such media may further be or be contained in a server or other device connected to a network such as the Internet that provides for the downloading of data and executable instructions.

Although the invention has been described with reference to particular implementations, the disclosed implementation are only examples and should not be taken as limitations. Various other adaptations and combinations of features of the implementations disclosed are within the scope defined by the following claims.

What is claimed is:

1. A device comprising:
a cross-point array containing a plurality of memory elements; and
an access circuit to access subsets of memory elements respectively corresponding to encoded blocks of data elements, wherein for each of the subsets of memory elements, a row or a column of the cross-point array that includes a first memory element in the subset and a second memory element in the subset further includes a third memory element that is between the first and second memory elements along the row or column and is in one of the subsets corresponding to another of the encoded blocks.

2. The device of claim 1, wherein for each of the subsets, each of the memory elements in the subset has a physical row address equal to $j*m+i$ for m a positive integer greater than 1 and fixed for the cross-point array, i a positive integer less than m and fixed for the subset, and j a positive integer that depends on the memory element.

3. The device of claim 2, wherein each of the memory elements in the subset has a physical column address equal to $k*l+i$ for a positive integer l greater than 1 and fixed for the cross-point array, i a positive integer less than l and fixed for the subset, and k a positive integer that depends on the memory element.

4. The device of claim 1, wherein for data elements that are in a row of one of the encoded block, the access circuit accesses only the memory elements that are distributed along a row of the cross-point array.

5. The device of claim 2, wherein for data elements that are in a column of one of the encoded blocks, the access circuit accesses only the memory elements that are distributed along a column of the cross-point array.

6. The device of claim 1, wherein the access circuit comprise a decoding circuit that:
in response to a first address signals representing a first value, selects a first row or column of the cross-point array; and
in response to a second address signals representing a second value that is consecutive with the first value, selects a second row or column of the cross-point array, wherein the second row or column is separated from the first row or column by at least one intervening row or column of the cross-point array.

7. A device comprising:
a cross-point array containing a plurality of memory elements;
a coding module to encode raw data into an encoded block; and
a write circuit to write the encoded block of data into a subset of the memory elements, wherein memory elements of the cross-point array that store data elements from a first encoded block of data are interspersed with memory elements of the cross-point array that store data elements from a second, different encoded block of data such that data elements from the first encoded block of data are not adjacent in the cross-point array.

8. The device of claim 7, wherein the cross-point array comprises:
a plurality of first conductive lines; and
a plurality of second conductive lines that cross the first conductive lines, wherein:
the memory elements are respectively at intersections where the second conductive lines cross the first conductive lines; and each of the memory elements provides a path between the first conductive line that crosses the memory element and the second conductive line that crosses the memory element, the path having a conductivity that depends on a data value stored in the memory element.

9. The device of claim 8, wherein no two of the memory elements that store data elements from the encoded block are consecutive along any of the first conductive lines.

10. The device of claim 8, wherein no two of the memory elements that store data elements from the encoded block are consecutive along any of the second conductive lines.

11. The device of claim 7, wherein the memory elements comprise memristor memory elements.

12. The device of claim 7, wherein for each of the subsets, each of the memory elements in the subset corresponding to any of the encoded blocks has a physical row address equal to $j*m+i$ for m a positive integer greater than 1 and fixed for the cross-point array, i a positive integer less than m and fixed for the subset, and j a positive integer that depends on the memory element.

13. The device of claim 12, wherein each of the memory elements in the subset has a physical column address equal to $k*l+i$ for a positive integer l greater than 1 and fixed for the cross-point array, i a positive integer less than l and fixed for the subset, and k a positive integer that depends on the memory element.

14. A method for accessing memory elements of a cross-point array, the method comprising:
identifying an encoded block corresponding to an address, wherein stored data elements for that encoded block are interspersed with stored data elements for a second encoded block in the cross-point array;
stepping the address by a parameter due to the interspersion of two different encoded blocks in the cross-point array; and
reading data elements from the cross-point array based on the stepped address, where due to the interspersion of two different encoded blocks in the cross point array, data elements that are adjacent along a row or column of the encoded block being addressed are not adjacent in the cross-point array.

15. A method for writing to a cross-point array, the method comprising:
encoding data to construct an encoded block; and
writing data elements of that encoded block to the cross-point array such that those data elements are interspersed with data elements in the cross-point array of a second, different encoded block, where, due to the interspersion of two different encoded blocks in the cross-point array, data elements that are adjacent along a row or column of either encoded block, as initially encoded, are not adjacent when that encoded block is stored in the cross-point array.

16. The device of claim 7, wherein the coding module encodes the raw data such that set ratio of ones and zeros occurs in the encoded block.

17. The device of claim 7, wherein each memory element of the cross-point array stores only a single bit of data.

18. The device of claim 7, wherein the write circuit intersperses data elements from three or more encoded blocks within the cross-point array.

19. The device of claim 7, wherein the physical row or column addresses for each data element in a single encoded block are mathematically related.

20. The device of claim 1, wherein the access circuit steps an address received for a data element to be accessed to account for the third memory element from another encoded block that is interspersed between memory elements of an addressed encoded block.

\* \* \* \* \*